United States Patent
Savic et al.

(10) Patent No.: US 7,518,465 B2
(45) Date of Patent: Apr. 14, 2009

(54) TUNABLE HIGH IMPEDANCE SURFACE DEVICE

(75) Inventors: Jovica Savic, Downers Grove, IL (US); Gregory J. Dunn, Arlington Heights, IL (US); John A. Svigelj, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 181 days.

(21) Appl. No.: 11/616,061

(22) Filed: Dec. 26, 2006

(65) Prior Publication Data

US 2008/0150657 A1 Jun. 26, 2008

(51) Int. Cl.
*H01P 1/06* (2006.01)
*H01P 5/04* (2006.01)
*H01Q 1/38* (2006.01)

(52) U.S. Cl. .............................. 333/24 R; 343/700 MS; 343/909

(58) Field of Classification Search .................. 343/909, 343/700 MS; 333/262, 101, 105, 24 R; 335/78
See application file for complete search history.

(56) References Cited

U.S. PATENT DOCUMENTS

| 6,483,480 | B1 | 11/2002 | Sievenpiper et al. |
| 6,538,621 | B1 | 3/2003 | Sievenpiper et al. |
| 6,762,661 | B1 * | 7/2004 | Higgins ........................ 333/258 |
| 7,068,234 | B2 * | 6/2006 | Sievenpiper ................. 343/745 |
| 7,423,608 | B2 * | 9/2008 | Dunn et al. .................. 343/909 |
| 2004/0227668 | A1 | 11/2004 | Sievenpiper et al. |
| 2004/0263408 | A1 | 12/2004 | Sievenpiper et al. |

* cited by examiner

*Primary Examiner*—Dean O Takaoka

(57) ABSTRACT

A tunable high impedance surface device (100) includes a conductive ground plane (105) and a plurality of conductive elements (110-114) electrically connected to the conductive ground plane (105). The device (100) also includes a plurality of capacitive elements (120-124) operable to vary a predetermined electromagnetic characteristic of the apparatus and standoffs (130, 132) between the plurality of capacitive elements (120-124) and the plurality of conductive elements (110-114). In one form, laser-drilled and electrically conductive micro-vias (136, 138) extend through the standoffs (130, 132) thereby electrically connecting the plurality of capacitive elements (120-124) to a data bus (140). The capacitive elements (120-124) may be integral with a circuit board (144) that supports the plurality conductive elements (110-114). Either the capacitive elements (120-124) or the conductive elements (110-114) are mechanically flexible and selectively movable to controllably adjust the distance (142) between the capacitive and conductive elements.

15 Claims, 4 Drawing Sheets

US 7,518,465 B2

TUNABLE HIGH IMPEDANCE SURFACE DEVICE

TECHNICAL FIELD

This invention relates generally to electromagnetic high impedance surfaces and more specifically to the application of micro-electromechanical switch-like elements to such surfaces.

BACKGROUND

High impedance surfaces are generally known. Such surfaces are generally used with antennas for generating signals that carry information to other remote devices. Another application includes use as an electromagnetic wave reflector. High impedance surfaces can have a variety of operational characteristics, which are based on the physical makeup of the high impedance surface, such as the size, shape, physical arrangement, and electromagnetic properties of the various conductive elements that comprise the high impedance surface. It is also known that varying the physical arrangement or electromagnetic properties of the surface changes the operational characteristics in a known manner.

For instance, high impedance surface antennas typically operate in a relatively narrow frequency band. The frequency band in an antenna application is dependent on the effective inductance and capacitance between the conductive elements. If this capacitance and/or inductance is varied, the surface's operating frequency is similarly varied. As such, varying the properties of the surface in a known manner, for example, can allow a user to create a surface with tunable properties.

Although a high impedance surface can function as an antenna, by other approaches a high impedance surface is often used with an antenna, in place of a conventional ground plane. A ground plane is usually part of an antenna design. In a cell phone, for example, the circuit board acts as a ground plane to the antenna. In such configurations, high impedance surfaces can provide additional functionality to the antenna.

Micro-electromechanical switches, commonly referred to as "MEMS," are also generally known in the art. MEMS switches are typically fabricated on silicon substrates, and then packaged to form a component that can be surface mounted on a printed circuit board. In another approach, MEMS switches are fabricated as integral parts of the printed circuit board; this allows circuit board manufacturers to create a large number of switches on a circuit board without having to surface mount or solder separate elements on the circuit board. Integral MEMS switches can be created on a circuit board at high volumes at relatively small incremental price increases. It is generally difficult, however, to reliably have all of the micro-electromechanical switches in a given application working properly, due to typical manufacturing yields when components are mass formed. MEMs switches fabricated as an integral part of a printed wiring board or circuit board utilizing organic based printed wiring board build-up materials are typically referred to as Meso-MEMs switches.

Furthermore, known attempts to surface mount micro-electromechanical switches or other electrical components onto high impedance surfaces to provide variable electromagnetic properties for the surface used methods that are costly, time consuming, and unreliable. Such known arrangements typically fail to provide fully integrated and controlled switches for satisfactorily varying the electromagnetic properties of the high impedance surfaces.

BRIEF DESCRIPTION OF THE DRAWINGS

The above needs are at least partially met through provision of the tunable high impedance surface device described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, a tunable high impedance surface apparatus or device includes a conductive ground plane and a plurality of conductive elements electrically connected to the conductive ground plane. The device also includes a plurality of capacitive elements operable to vary a predetermined electromagnetic characteristic of the apparatus and standoffs between the plurality of capacitive elements and the plurality of conductive elements. By one approach, laser-drilled and electrically conductive micro-vias extend through the standoffs thereby electrically connecting the plurality of capacitive elements to a data bus. In another approach, the capacitive elements, which are themselves also at least in part conductive, are integral with a circuit board that supports the plurality of conductive elements. Typically, the capacitive elements are spaced by a predetermined distance therebetween, and either the capacitive elements or the conductive elements are mechanically flexible and selectively movable to adjust the distance between the capacitive and conductive elements.

In a tunable high impedance surface device so configured, changing the adjustable distance between the capacitive and conductive elements varies the serial capacitance between two elements, which varies the electromagnetic properties of the tunable high impedance surface device in a predictable manner. Furthermore, the capacitive elements may comprise micro-electromechanical switch-like elements that can be added to the device through high volume methods at a relatively small cost per switch. Advantageously, the tunable high impedance surface device will typically operate reliably even in the event that not every capacitive element functions correctly.

Figure 1:
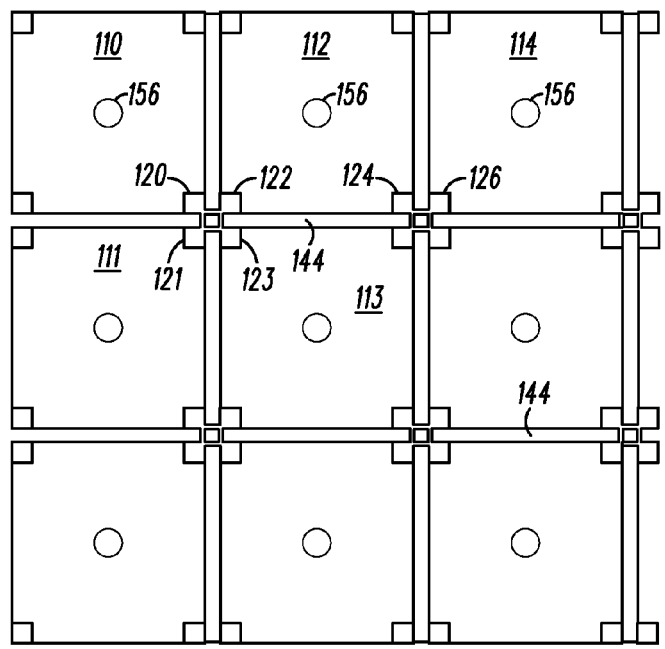
FIG. 1 comprises a plan view of a tunable high impedance surface device.
Figure 2:
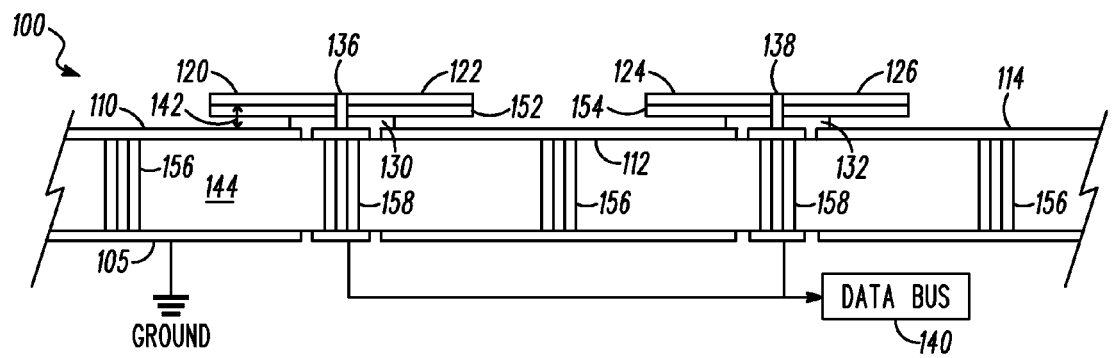
FIG. 2 comprises a cross-sectional view of the tunable high impedance surface device of FIG. 1.

These and other benefits may become clearer upon making a thorough review and study of the following detailed description. Referring now to the drawings, and in particular to FIGS. 1 and 2, a tunable high impedance surface device 100 includes a conductive ground plane 105 and a plurality of conductive elements 110, 111, 112, 113, and 114 electrically connected to the conductive ground plane 105. The device also includes a plurality of capacitive elements 120, 121, 122, 123, 124, and 126 disposed at a predetermined position relative to the conductive elements 110, 111, 112, 113, and 114 to allow for a predetermined electromagnetic characteristic of the device 100 to be varied. The capacitive elements 120, 122, 124, and 126 are positioned vertically above and over conductive elements 110, 112, and 114 by a predetermined distance or spacing to create a capacitive effect between the capacitive elements 120, 122, 124, and 126 and the conductive elements 110, 112, and 114, and hence a serial capacitive effect between the conductive elements 110, 112, and 114. For example, capacitive element 120 is capacitively coupled to conductive element 110, capacitive element 122 is capacitively coupled to conductive element 112, and capacitive elements 120 and 122 are conductively connected. Therefore, a serial capacitance exists between conductive elements 110 and 112.

Standoffs 130 and 132 between the plurality of capacitive elements 120, 122, 124, and 126 and the plurality of conductive elements 110, 112, and 114 support the capacitive elements in overlying relation relative to the conductive elements. Electrically conductive micro-vias 136 and 138 extending through the integral standoffs 130 and 132, respectively, electrically connect the plurality of capacitive elements 120, 122, 124, and 126 to a data bus 140. The data bus 140 operatively connects to a controller (not shown) that sends control signals to and/or controls a voltage at the individual capacitive elements 120, 122, 124 and 126. The micro-vias 136 and 138 are typically formed using a carbon dioxide or ultraviolet laser to drill into the standoffs 130 and 132 where a further electrical connection as described below connects the capacitive elements 120, 122, 124, and 126 to the data bus 140.

Typically, the conductive ground plane 105 and the plurality of conductive elements 110, 112, and 114 are disposed on opposite sides of a primary circuit board 144. For instance, as illustrated in FIG. 1 the conductive elements 110, 111, 112, 113, and 114 are disposed on the primary circuit board 144 with spaces therebetween showing the board 144. Similarly, the capacitive elements 120, 122, 124, and 126 are disposed on secondary circuit boards 152 and 154. The secondary circuit boards 152 and 154 are secured to the primary circuit board 144 through the standoffs 130 and 132. Typically, the secondary circuit boards 152 and 154 are made of a laser-scribed polyimide flex material, which is a relatively thin, flexible circuit board material known in the art. As illustrated, the integral standoffs 130 and 132 are formed from cured photodielectric material disposed between the primary circuit board 144 and a portion of at least one of the plurality of capacitive elements 120, 122, 124, and 126. As shown, the standoffs 130 and 132 each support and integrate four capacitive elements with the primary circuit board 144. The primary circuit board 144 will typically include a plurality of conductive vias 158 that extend through the body of the circuit board 144 for connecting the plurality of capacitive elements 120, 122, 124, and 126 to the data bus 140.

So configured, each of the plurality of the conductive capacitive elements 120, 122, 124, and 126 is integrated with the primary circuit board 144 through the integral standoffs 130 and 132 disposed on the primary circuit board 144. In other words, the capacitive elements 120, 122, 124, and 126 are affixed to and integrated with the primary circuit board 144 through the integral standoffs 130 and 132 without the need to surface mount separate elements.

An example arrangement of the capacitive elements relative to the conductive elements will be described further with reference to FIG. 1. A capacitive element 120 is positioned over a portion of a conductive element 110 and spaced thereover by a predetermined vertical distance 142. Because both the capacitive element 120 and conductive element 110 are conductive, a capacitance can be created between the two. This capacitance can be manipulated to vary the electromagnetic properties of the high impedance surface device 100. Non-limiting example electromagnetic properties for the high impedance surface device 100 that can be manipulated include the ability to send or reflect electromagnetic signals at various frequencies, the nature of the reflected electromagnetic signals, and the ability to suppress or block the propagation of electromagnetic waves across the surface.

One way to vary the capacitance between the conductive elements and the capacitive elements is to controllably vary the distance 142 as by having at least one of either of the plurality of conductive elements 110, 112, and 114 and the plurality of capacitive elements 120, 122, 124, and 126 be mechanically flexible and selectively movable. By changing the distance 142, the capacitance of the structure is also changed, which in turn can vary the electromagnetic properties for the high impedance surface device 100.

Typically, each capacitive element 120 and 122 is spaced from and shaped to substantially match portions of at least two of the plurality of conductive elements 110 and 112. For instance, with further reference to FIG. 1, capacitive element portions 120 and 122 are electrically connected to the same micro-via 136 and have a square configuration to match the underlying adjacent, square corner portions of the conductive elements 110 and 112. Manifestly, other configurations could also be employed. By substantially matching the shape of the capacitive element portions 120 and 122 to the outer edges of the underlying conductive elements 110 and 112, little material of the capacitive element portions 120 and 122 is wasted, and the surface area for providing a capacitive effect is maximized. Further, by minimizing the amount of material connecting the capacitive element portion 120 and the support 130, the capacitive element portion 120 has improved flexibility, which improves the ability to adjust the distance 142 between the capacitive element portion 120 and the conductive element 110. For instance, the distance 142 may be selectively adjustable to be between approximately zero thousands of an inch and approximately twelve thousandths of an inch.

By one approach, the distance 142 may be selectively adjustable through the application of an electrical potential difference between the plurality of conductive elements 110, 112, and 114 and the plurality of capacitive elements 120, 122, 124, and 126, typically through the data bus 140. The potential difference can be manipulated to create electrostatic forces to pull or draw the capacitive element portions 120 and 122 closer to the conductive elements 110 and 112.

By another approach, the distance 142 may be adjusted by flexing the primary circuit board 144. Flexing the primary circuit board 144 will move the conductive elements 110, 112, and 114 relative to the capacitive elements 120, 122, 124, and 126 in a known manner depending on how the primary circuit board 144 is flexed. By one approach, the primary circuit board 144 may be flexed in a convex manner on the side with the conductive layer portions 120, 122, 124, and 126 thereby shifting the capacitive elements 120, 122, 124, and 126 away from the conductive elements 110, 112, and 114. In other words, the board 144 is bowed in a manner that pulls the conductive elements 110, 112, and 114 away from the capacitive elements 120, 122, 124, and 126. Another approach includes flexing the primary circuit board 144 in a concave manner thereby shifting the conductive elements 110, 112, and 114 toward the capacitive elements 120, 122, 124, and 126. Yet another approach includes variably flexing the primary circuit board 144 so that certain capacitive elements are closer to their corresponding conductive elements whereas others are farther from their corresponding conductive elements.

Figure 3:
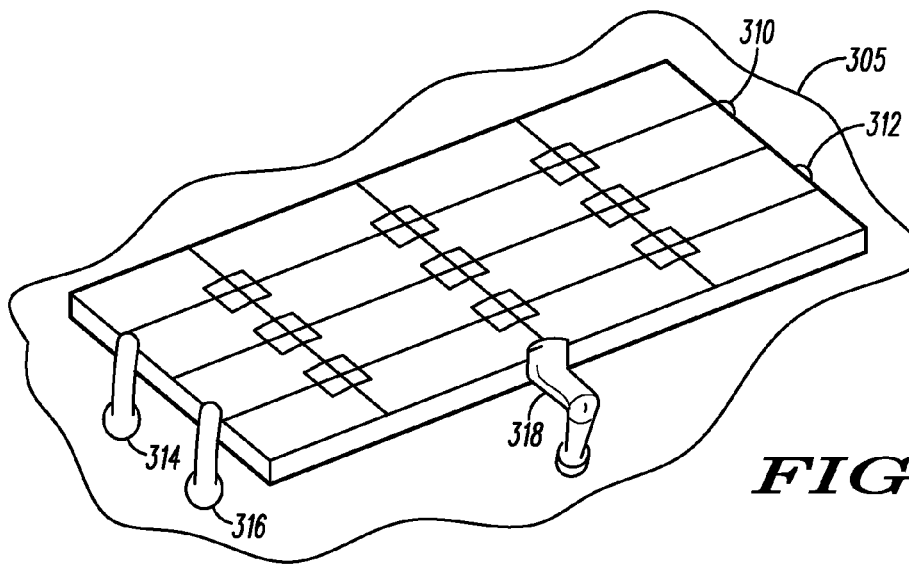
FIG. 3 comprises a perspective view of a tunable high impedance surface device.

One approach to the mounts for the high impedance surface device 100 will be described with reference to FIG. 3. Typically, the high impedance surface device 100 will be mounted within a housing 305. At least two mounts 310, 312, 314, 316, and 318 are affixed to the primary circuit board 144 wherein at least one of the mounts is a movable mount 318. As depicted in FIG. 3, four mounts 310, 312, 314, and 316 provide a fixed support for the device 100 and the movable mount 318 can be shifted to controllably deform the primary circuit board 144. By one approach, the at least one movable mount 318 is a piston movable relative to the primary circuit board 144 to controllably deform it. Various configurations of the mounts 310, 312, 314, and 316 and movable mounts 318 are possible to provide various deformation configurations for the device 100. For instance, the mounts may engage a middle portion of the primary circuit board 144 instead of its edges. Similarly, multiple movable mounts may be included and variably positioned to controllably deform the high impedance surface device 100 in a variety of configurations.

Figure 4:
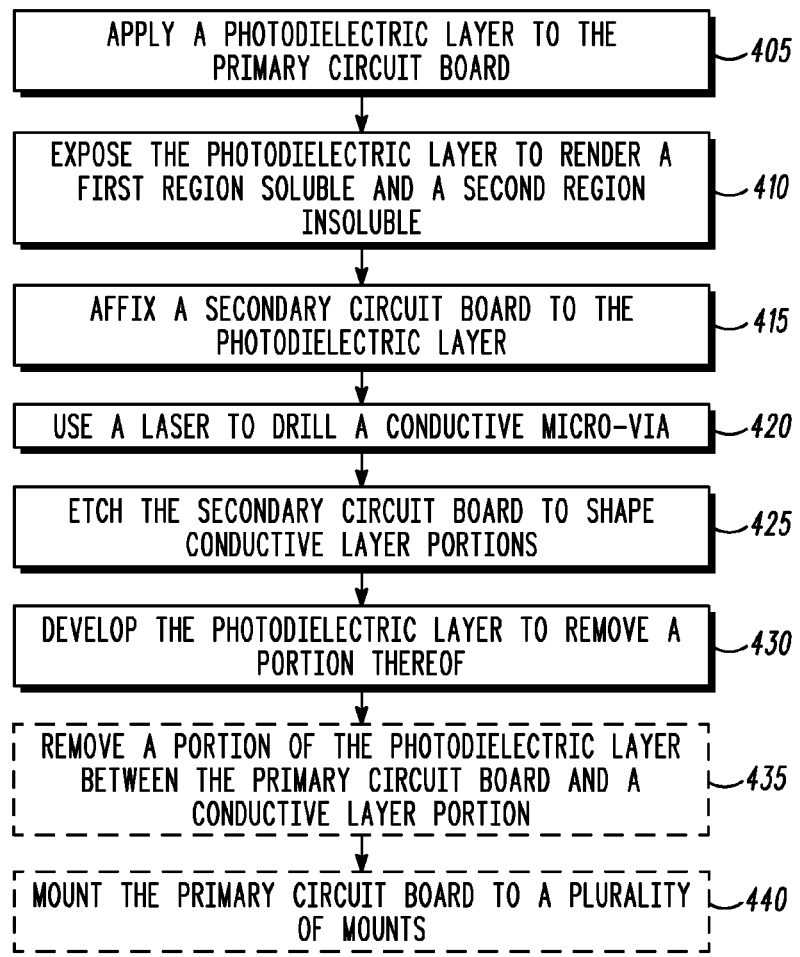
FIG. 4 comprises a flow chart of a method of making a tunable high impedance surface device.

A process for making tunable high impedance surface devices will be described with reference to FIGS. 4 through 10 with various processing or manufacturing steps shown in the flowchart 400 of FIG. 4. A typical tunable high impedance surface device includes a substantially continuous ground plane 105 on a first side of a primary circuit board 144 that is electrically connected to a plurality of conductive elements 505 and 510 on a second side of the primary circuit board 144. The primary circuit board 144 is typically of an FR-4 type, which is known in the art, although other conventional circuit boards and/or materials may be utilized. The ground plane 105 and conductive elements 505 and 510 are formed on the primary circuit board 144 using conventional processes such as photolithographic patterning of copper foils adhered to the primary circuit board and/or copper plated on the primary circuit board, and conventional electrically conductive vias 158 extending through the body of the circuit board 144 are formed by mechanical or laser drilling and copper plating processes to electrically connect the ground plane 105 to the conductive elements 505 and 510.

Figure 5:
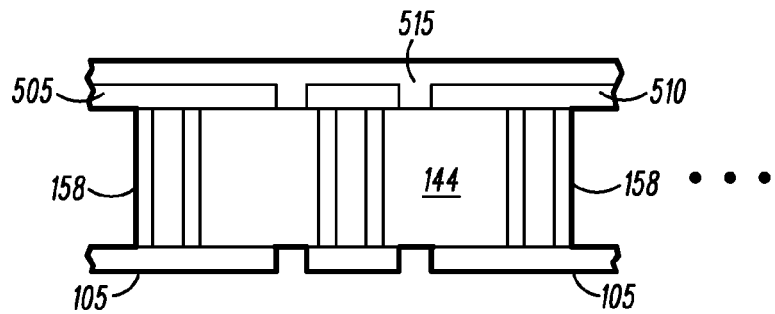
FIG. 5 comprises an elevational view similar to FIG. 2 showing the device during a step in an exemplary process of manufacture thereof, FIG. 6 comprises an elevational view similar to FIG. 2 showing the device during a step in an exemplary process of manufacture thereof, FIG. 7 comprises an elevational view similar to FIG. 2 showing the device during a step in an exemplary process of manufacture thereof, FIG. 8 comprises an elevational view similar to FIG. 2 showing the device during a step in an exemplary process of manufacture thereof, FIG. 9 comprises an elevational view similar to FIG. 2 showing the device during a step in an exemplary process of manufacture thereof, and FIG. 10 comprises an elevational view similar to FIG. 2 showing the device during a step in an exemplary process of manufacture thereof.
Figure 6:
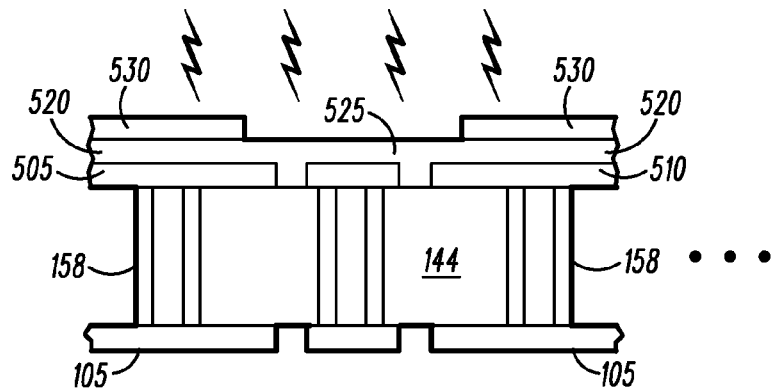

The example manufacturing process as set forth in the flowchart 400 includes applying an uncured photodielectric layer 515, as depicted in FIG. 5, to the second side of the primary circuit board 144 in step 405 and exposing the photodielectric layer 515, as depicted in FIG. 6, through a mask 530 to render a first region 520 soluble and a second region 525 insoluble in step 410. The photodielectric layer 515 may be a positive or negative acting photodielectric and therefore the mask 530 may be a positive or negative image of the desired photodielectric pattern. In the example shown, a negative photodielectric is used and the mask 530 allows a region 525 to be exposed and rendered insoluble while masking a region 520, which remains soluble.

Figure 7:
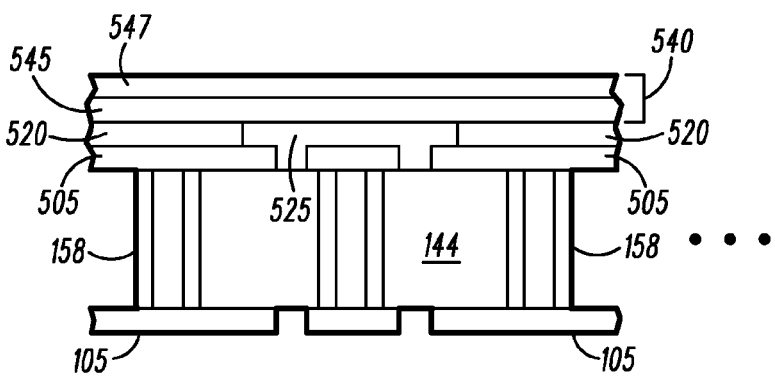

Next, a secondary circuit board 540 is affixed in step 415 to the photodielectric layer 515, as depicted in FIG. 7, such that the photodielectric layer 515 is sandwiched between the secondary circuit board 540 and the primary circuit board 144. The secondary circuit board 540 may be affixed 415 by laminating it to the uncured photodielectric, which acts as an adhesive, or by using any methods known in the art such as through the use of an additional adhesive, a laminate, or the like. Typically, the secondary circuit board 540 is a polyimide flex material 545, although other materials such as FR-4 flex or Liquid Crystal Polymer (LCP) can also be used, with a copper or other conductive coating 547 pre-applied using known methods. Using known techniques such as photolithographic patterning, pattern plating, or laser scribing, the conductive coating 547 is shaped, either before secondary circuit board 540 is applied or in step 425 or through a combination of patterning steps performed before and after application of secondary circuit board 540, to become the capacitive conductive layer portions 555 and 560. The secondary circuit board 540 may be affixed 415 to the photodielectric layer 515 with either the polyimide flex material 545 side or the conductive coating 547 side adhered to the photodielectric layer 515. FIG. 7 depicts an arrangement with the polyimide flex material 545 side adhered to the photodielectric layer 515. In another approach, the secondary circuit board 540 may simply consist of bare copper foil or similar conductive film which may be shaped into a desired pattern. In such an approach, the secondary circuit board 540 is essentially reduced to the conductive coating 547.

Figure 8:
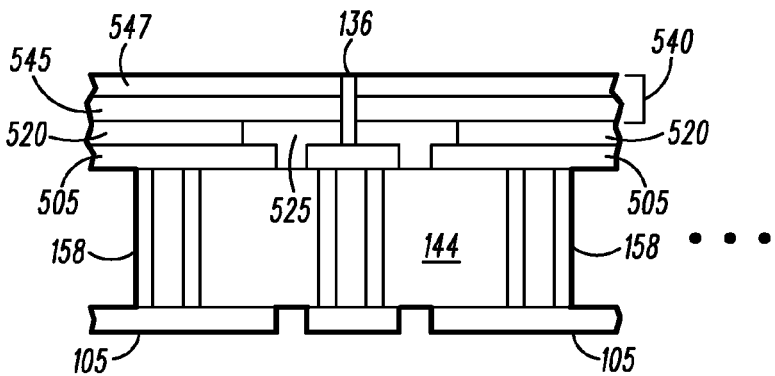

A laser is used in step 420 to drill a conductive micro-via 136, as depicted in FIG. 8, through the secondary circuit board 540 and the photodielectric layer 515, and specifically, the central, insoluble region 525 thereof. The laser is typically a carbon dioxide based laser, although an ultraviolet laser or other drilling lasers may be used. Optionally, the laser drilling may cure at least a portion of the insoluble second region 525 of the photodielectric layer 515 adjacent to the conductive micro-via 136. This curing action takes place typically as a result of localized heating of the photodielectric layer 515 during the drilling process for forming the micro-via 136. The micro-via 136 is drilled to correspond to a location of or be in line with a conventional electrically conductive via 158 through the primary circuit board 144. After drilling, the micro-via 136 is solid plated with a conductor such as copper or filled by known means with a conductive paste in order to provide an electrically conductive path. The micro-via 136 can then connect electrically through the conventional via 158 to the data bus 140 that may control the electrical potential of the conductive capacitive elements. By another approach, the micro-via 136 may be offset from, but still electrically connected to, the conventional via 158.

Figure 9:
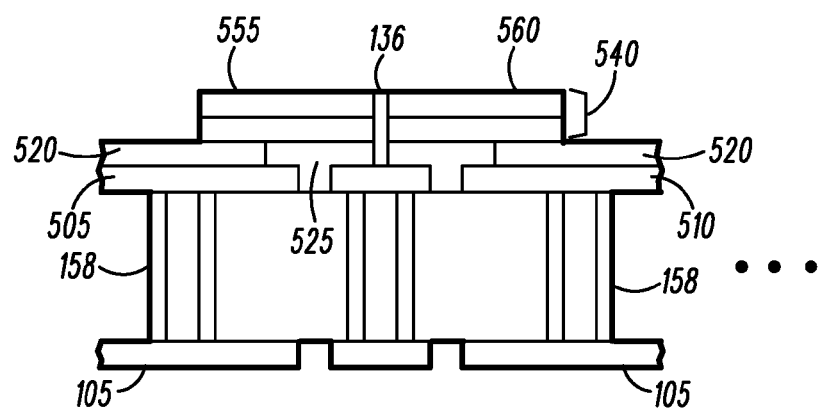

The example manufacturing process as set forth in the flowchart 400 includes etching the secondary circuit board 540, as depicted in FIG. 9, to shape the conductive layer portions 555 and 560 in step 425 with the conductive portions 555 and 560 being spaced above at least one of the plurality of conductive elements 505 and 510. As shown, the conductive layer or portion 555 extends laterally from the micro-via 136 to extend over the corresponding underlying insoluble region 525 extending from the micro-via 136 and beyond to extend over a portion of the conductive element 505 including a portion of the soluble region 520 of the photodielectric layer therebetween. The conductive layer portion 560 extends in a similar manner to the opposite portion 555, but in a generally opposite lateral direction from the micro-via 136 so as to extend over the corresponding underlying insoluble region 525 and beyond to extend over a portion of the conductive element 510, including a portion of the soluble region 520 of the photodielectric layer therebetween.

In one embodiment, the "flex" material 545 along with the conductive portions 555 and 560 may be partially shaped at an earlier step, and the etching step performed in 425 completes the shaping by removing bus bars (not shown) between the conductive portions 555 and 560 that provided electrical continuity across the conductive portions 555 and 560 to allow electroplating of the micro-vias 136. The etching process 425 may be a conventional laser cutting and cleaning processes and/or industry known copper or metal etching processes to remove unnecessary material. Thus, after etching 425 the secondary circuit board 540, only the portions of the secondary circuit 540 board that support the capacitive layer portions 555 and 560 and connect these portions 555 and 560 to the micro-vias 136 and photodielectric layer 515 are left. In other words, after etching, the secondary circuit board 540 only extends as far as the conductive coating 547 thereon for fully supporting the capacitive elements 555 and 560. These remaining layer portions 555 and 560 form a pattern of capacitive elements disposed over portions of the conductive elements 505 and 510 of the high impedance surface.

Figure 10:
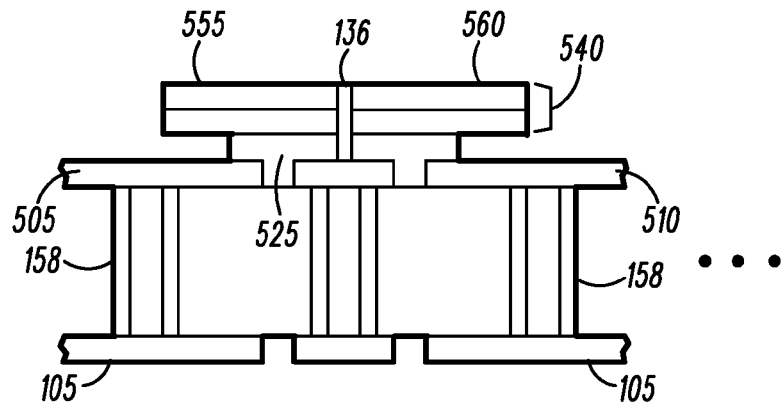

Referring to FIGS. 1 and 10, the etching process leaves four electrically connected conductive layer portions 555 and 560 (which correspond to capacitive elements 120 and 122 in FIG. 1) extending radially out from each micro-via 136 to extend over four corresponding underlying conductive elements 505 and 510 disposed on the primary circuit board 144. As shown in the illustrated form, the conductive layer portions 120, 121, 122, and 123 are arranged so that their perimeters form a square configuration with each smaller square conductive layer portion 120, 121, 122, and 123 overlying one square corner portion of the larger underlying conductive portions 110, 111, 112, and 113 on the primary circuit board 144. Each of the four corner portions of the circuit conductive layer on the primary circuit board 144, therefore, have corresponding capacitive conductive layer portions in overlying relation thereto in the same manner as described above. Other shapes and configures for the various layer portions are also possible.

The process 400 then includes developing the photodielectric layer 515 to remove at least a substantial portion of the soluble first region 520 of the photodielectric layer 515 in step 430 and as depicted in FIG. 10. Typically, this step 430 of the process 400 includes developing the soluble first region 520 in a solution of Gamma-butyrolactone (GBL) in a vessel equipped with ultrasonic agitation. The development process results in removing 435 at least a portion of the photodielectric layer 515 sandwiched between the primary circuit board 144 and at least one of the capacitive conductive layer portions 555 and 560 of the secondary circuit board 540 thereby creating the space or separation needed to provide the adjustable distance 142 between the capacitive conductive layer portions 555 and 560 and the conductive elements 505 and 510. The remaining portion of the photodielectric layer 515 thereby acts as a supporting and integral standoff for the capacitive conductive layer portions 555 and 560. As shown, the remaining photodielectric insoluble, cured supporting portion 525 forms a generally annular configuration about the micro-via 136 extending up from the primary circuit board 144 to create a pedestal for the capacitive elements 555 and 560 including the circuit board material 545 thereof.

So configured, the cantilevered capacitive conductive layer portions 555 and 560 may be considered micro-electromechanical switch-like structures that are made integral with the primary circuit board 144. Using such a process 400 allows for the creation of high numbers of the micro-electromechanical switch-like capacitive conductive layer portions in a high impedance surface application at a low per-switch cost. Moreover, the high impedance surface device made using these integrated capacitive conductive layer portions can function without all of the capacitive conductive layer portions operating perfectly.

The process 400 optionally includes mounting the primary circuit board 144 to a plurality of mounts in step 440 wherein at least one of the plurality of mounts is selectively movable to controllably deform the primary circuit board 144. This step of the process 400 encompasses the mounting of the finished high impedance surface within a housing 305 for its use. As discussed above, the mounts provide support for the high impedance surface device 100 within the housing 305 and, optionally, can include a movable mount for selectively deforming the primary circuit board 144 to adjust the distance 142 between the capacitive conductive layer portions 555 and 560 and the conductive elements 505 and 510 thereby adjusting the electromagnetic properties of the device.

Those skilled in the art will recognize that a wide variety of modifications, alterations, and combinations can be made with respect to the above described embodiments without departing from the spirit and scope of the invention. For example, the number, configuration, and shape of the conductive elements and the capacitive elements may differ from those illustrated herein. The conductive elements may have triangular, octagonal, or other shapes. Similarly, different number of capacitive elements may be supported by a given standoff, and the shapes and sizes of the capacitive elements may vary to match a given application or set of conductive elements. Such modifications, alterations, and combinations are to be viewed as being within the ambit of the inventive concept.

We claim:

1. A tunable high impedance apparatus comprising:
a conductive ground plane;
a plurality of conductive elements electrically connected to the conductive ground plane;
a plurality of capacitive elements disposed at a predetermined position relative to the conductive elements to allow for a predetermined electromagnetic characteristic to be controllably varied;
standoffs between the plurality of capacitive elements and the plurality of conductive elements; and
electrically conductive micro-vias extending through the standoffs electrically connecting the plurality of capacitive elements to a data bus.

2. The apparatus of claim 1 wherein the capacitive elements are spaced by a distance from the conductive elements, and at least one of a group comprising the plurality of conductive elements and the plurality of capacitive elements are mechanically flexible and selectively movable to adjust the distance between the plurality of capacitive elements and the plurality of conductive elements to controllably vary the predetermined electromagnetic characteristic.

3. The apparatus of claim 1 including a primary circuit board having the conductive ground plane and the plurality of conductive elements disposed on opposite sides thereof.

4. The apparatus of claim 3 further comprising at least two mounts affixed to the primary circuit board with at least one of the mounts being movable.

5. The apparatus of claim 4 wherein the at least one movable mount comprises a piston movable relative to the primary circuit board to controllably deform the primary circuit board.

6. The apparatus of claim 3 wherein the plurality of capacitive elements are disposed on secondary circuit boards.

7. The apparatus of claim 6 wherein the secondary circuit boards are secured to the primary circuit board through the standoffs.

8. The apparatus of claim 6 wherein the secondary circuit board comprises a laser-scribed polyimide flex material.

9. The apparatus of claim 1 wherein the standoffs comprise cured photodielectric material disposed between the primary circuit board and a portion of one of the plurality of capacitive elements.

10. The apparatus of claim 3 further comprising a plurality of conductive vias extending through the primary circuit board for connecting the plurality of capacitive elements to the data bus.

11. The apparatus of claim 1 wherein each of the plurality of capacitive elements is spaced from an underlying one of the conductive elements by a predetermined distance and shaped to substantially match at least a portion of an outer edge of the underlying conductive element.

12. The apparatus of claim 2 wherein the distance is selectively adjustable to be between approximately zero thousandths of an inch and approximately twelve thousandths of an inch.

13. The apparatus of claim 2 wherein the data bus can selectively apply an electrical charge to at least some of the plurality of capacitive elements to create a potential difference between the at least some of plurality of capacitive elements and the conductive elements disposed relative to the at least some of plurality of capacitive elements such that the distance between the plurality of conductive elements and the plurality of capacitive elements is selectively adjusted.

14. An apparatus comprising:
a conductive ground plane disposed on a first side of a circuit board;
a plurality of conductive elements disposed on a second side of the circuit board and electrically connected to the conductive ground plane;
a second plurality of conductive elements that are spaced relative to the second side of the circuit board and adjacent to at least two of the plurality of conductive elements thereon;
integral standoffs disposed on the second side of the circuit board and affixed to the second plurality of conductive elements for supporting and integrating the second plurality of conductive elements to the circuit board;
laser-drilled and electrically conductive micro-vias electrically connecting the second plurality of conductive elements through the integral standoffs to a second plurality of conductive vias in the circuit board connected to a data bus.

15. The apparatus of claim 14 wherein at least one of a group comprising the plurality of conductive elements and the second plurality of conductive elements is mechanically flexible and selectively movable to adjust a distance between the plurality of conductive elements and the second plurality of conductive elements.

* * * * *